United States Patent
Kim et al.

(10) Patent No.: US 12,080,750 B2
(45) Date of Patent: Sep. 3, 2024

(54) LIGHT EMITTING DIODE PRECURSOR INCLUDING A PASSIVATION LAYER

(71) Applicant: PLESSEY SEMICONDUCTORS LIMITED, Plymouth (GB)

(72) Inventors: Jun-Youn Kim, Plymouth (GB); Mohsin Aziz, Plymouth (GB); John Shannon, Plymouth (GB); Kevin Stribley, Plymouth (GB); Ian Daniels, Plymouth (GB)

(73) Assignee: Plessey Semiconductors Limited, Plymouth (GB)

( * ) Notice: Subject to any disclaimer, the term of this patent is extended or adjusted under 35 U.S.C. 154(b) by 422 days.

(21) Appl. No.: 17/613,784

(22) PCT Filed: May 19, 2020

(86) PCT No.: PCT/EP2020/063930
§ 371 (c)(1),
(2) Date: Nov. 23, 2021

(87) PCT Pub. No.: WO2020/239529
PCT Pub. Date: Dec. 3, 2020

(65) Prior Publication Data
US 2022/0231081 A1   Jul. 21, 2022

(30) Foreign Application Priority Data
May 24, 2019 (GB) .................................... 1907381

(51) Int. Cl.
*H01L 27/15* (2006.01)
(52) U.S. Cl.
CPC ................... *H01L 27/156* (2013.01)
(58) Field of Classification Search
CPC ......... H01L 33/20; H01L 33/32; H01L 33/16; H01L 33/007; H01L 33/44; H01L 27/156;
(Continued)

(56) References Cited

U.S. PATENT DOCUMENTS 7,067,853 B1 *   6/2006   Yao ..................... H01L 31/153
                                                   257/187
10,923,630 B1 *  2/2021   Pynn ...................... H01L 33/16
(Continued)

FOREIGN PATENT DOCUMENTS

| JP | 2007188962 A | 7/2007 |
| JP | 2014022685 A | 2/2014 |
| WO | 2016111789 A1 | 7/2016 |

OTHER PUBLICATIONS

International Search Report and Written Opinion, PCT/EP2020/063930, dated Jul. 24, 2020, 22 pages.
(Continued)

*Primary Examiner* — Mouloucoulaye Inoussa
(74) *Attorney, Agent, or Firm* — Stinson LLP

(57) ABSTRACT

A light emitting diode (LED) precursor is provided. The LED precursor comprises a substrate (10), an LED structure (30) comprising a plurality of Group III-nitride layers, and a passivation layer (40). The LED structure comprises a p-type semiconductor layer (36), an n-type semiconductor layer (32), and an active layer (34) between the p-type and n-type semiconductor layers. Each of the plurality of Group III-nitride layers comprises a crystalline Group III-nitride. The LED structure has a sidewall (37) which extends in a plane orthogonal to a (0001) crystal plane of the Group III-nitride layers. The passivation layer is provided on the sidewall of the LED structure such that the passivation layer covers the active layer. The passivation layer comprises a crystalline Group III-nitride with a bandgap higher than a bandgap of the active layer. The LED structure is shaped such that the sidewall of the LED structure is aligned with a non-polar crystal plane of each the Group III-nitride layers of the LED structure.

12 Claims, 7 Drawing Sheets

(58) Field of Classification Search
CPC ... H01L 33/025; H01L 33/14; H01L 33/0095;
H01L 33/145; H01L 33/06; H01L 33/30;
H01L 33/24; H01L 33/38; H01L 33/02;
H01L 33/56; H01L 33/08; H01L 33/26;
H01L 33/343; H01L 29/1606; H01L
31/03044; H01L 33/325; H01L 33/0075;
H01L 31/1848; H01L 31/105; H01L
31/03048; H01L 31/0288; H01L 29/167;
H01L 31/1856; H01L 31/035263; H01L
33/0012; H01L 33/12; H01L 31/03042;
H01L 33/0093; H01L 33/60; H01L 33/58;
H01L 33/46; H01L 33/0025; H01L 33/18;
H01L 2933/0083; H01L 2224/4852;
H01L 2224/48465; H01L 2224/48091;
H01L 2224/16225; H01L 2924/00014;
H01L 2924/16152; H01L 2224/45099;
H01S 5/0203; H01S 5/026; H01S 5/125;
H01S 5/0207; H01S 5/4031; H01S
5/1039; H01S 5/04257; H01S 5/028;
H01S 5/4025; H01S 5/2201; H01S
5/0217; H01S 5/4093; H01S 5/32341;
H01S 5/0216; Y02E 10/50; G02B
26/0833; G02B 2027/0178; G02B
2027/0138; G02B 2027/0134; G02B
2027/014; G02B 2027/0116
See application file for complete search history.

(56) References Cited

U.S. PATENT DOCUMENTS

| | | |
|---|---|---|
| 2006/0006500 A1 | 1/2006 | Piner et al. |
| 2008/0144684 A1 | 6/2008 | Tamura et al. |
| 2009/0224240 A1* | 9/2009 | Shinagawa ............ B82Y 20/00 |
| | | 257/E33.013 |
| 2009/0238227 A1* | 9/2009 | Kubota ............... H01S 5/32025 |
| | | 372/45.011 |
| 2012/0057612 A1 | 3/2012 | Yoshida et al. |
| 2013/0105836 A1 | 5/2013 | Yokozeki et al. |
| 2015/0115312 A1* | 4/2015 | Saga ...................... H01L 33/32 |
| | | 257/101 |
| 2016/0197232 A1* | 7/2016 | Bour ...................... H01L 33/06 |
| | | 257/13 |
| 2016/0365480 A1 | 12/2016 | Mi et al. |
| 2017/0263809 A1* | 9/2017 | Atanackovic ......... H01L 33/343 |
| 2018/0062040 A1 | 3/2018 | Simin et al. |
| 2018/0175248 A1 | 6/2018 | Ahmed |
| 2019/0165213 A1* | 5/2019 | Yonkee ................... H01L 33/32 |
| 2019/0207043 A1* | 7/2019 | Yonkee ............. H01L 21/02579 |
| 2019/0348568 A1* | 11/2019 | König ................... H01S 5/0203 |
| 2021/0104504 A1* | 4/2021 | Yonkee ................. H01L 33/387 |
| 2023/0268460 A1* | 8/2023 | Amstatt ................. H01L 33/18 |
| | | 257/79 |

OTHER PUBLICATIONS

Masui et al., "Nonpolar and Semipolar III-Nitride Light-Emitting Diodes: Achievements and Challenges", IEEE Transactions on Electron Devices, vol. 57, Issue: 1, Jan. 2010, pp. 88-100.

Search Report for Taiwan Invention Patent Application No. 109116639, dated Mar. 10, 2021, 13 pages.

Great Britain Search Report, Application No. GB1907381.6, dated Nov. 4, 2019, 7 pages.

Zhao et al., "Three-Dimensional Quantum Confinement of Charge Carriers in Self-Organized AlGaN Nanowires: A Viable Route to Electrically Injected Deep Ultraviolet Lasers", Nano Letters, 2015, vol. 15, No. 12, pp. 7801-7807.

* cited by examiner

Detail B:

LIGHT EMITTING DIODE PRECURSOR INCLUDING A PASSIVATION LAYER

REFERENCE TO RELATED APPLICATIONS

This application is a U.S. national stage application of International Patent Application No. PCT/EP2020/063930, filed May 19, 2020, which claims the benefit of Great Britain Patent Application No. 1907381.6, filed May 24, 2019, the entire disclosures of which are incorporated herein by reference.

FIELD OF THE DISCLOSURE

The present disclosure relates to Group III-nitride semiconductors. In particular, the present disclosure relates to Light Emitting Diodes (LEDs) comprising III-nitride semiconductors.

BACKGROUND

Micro LED arrays are commonly defined as arrays of LEDs with a size of 100×100 μm2 or less. Micro LED arrays are self-emitting micro-displays/projectors which may be suitable for use in a variety of devices such as smartwatches, head-wearing displays, head-up displays, camcorders, viewfinders, multisite excitation sources, and pico-projectors.

One known form of a micro-LED array comprises a plurality of LEDs formed from Group III-nitrides. Group III-nitride LEDs are inorganic semiconductor LEDs containing GaN and its alloys with InN and AlN in the active light-emitting region. Group III-nitride LEDs can be driven at significantly higher current density and emit a higher optical power density than conventional large-area LEDs, for example organic light emitting diodes (OLED) in which the light-emitting layer is an organic compound. As a result, higher luminance (brightness), defined as the amount of light emitted per unit area of the light source in a given direction, makes micro LEDs suitable for applications requiring or benefiting from, high brightness. For example, applications which benefit from high brightness may include displays in high brightness environments or projectors. Additionally, Group III-nitride micro LEDs are known to have relatively high luminous efficacy, expressed in lumens per watt (lm/VV) compared to other conventional large area LEDs. The relatively high luminous efficacy of Group III-nitride micro LED arrays reduces power usage compared with other light sources and makes micro LEDs particularly suitable for portable devices.

One important performance characteristic of LEDs is internal quantum efficiency (IQE). IQE is a measure of the ratio of radiative recombination events occurring in an LED, relative to the total number of recombination events (i.e. including non-radiative recombination events) occurring in the LED. For Group III-nitride LEDs, the bulk crystal structure may be interrupted by defects in the crystal lattice. Such defects may include dangling bonds or vacancies in the crystal lattice. Vacancies and dangling bonds may provide trap sites in the energy band, leading to non-radiative recombination events which reduce IQE. In particular, surfaces of an LED structure may be vulnerable to the formation of defects during fabrication of the surfaces of the LED. Defects at surfaces of a Group III-nitride LED may result in non-radiative surface recombination events which reduce IQE.

For micro-LEDs, it will be appreciated that the reduction in size of the LEDs may increase the amount of surface recombination relative to bulk radiative recombination events, due to the increase in surface area to volume ratio as the size of the LEDs are reduced.

US-A-2016/0197232 discloses LED structures having reduced non-radiative sidewall recombination. The LED structures include p-n junction sidewalls that span a top current spreading layer, a bottom current spreading layer, and an active layer between the top and bottom current spreading layers.

US 2018/0175248 discloses micro LED structures which are passivated with a Group III-nitride passivation material including Al. It is disclosed that the Group III-nitride passivation material may reduce non-radiative recombination, reducing leakage current of an LED structure and/or improving luminous efficiency.

However, there remains a need to further improve the IQE of Group III-nitride LEDs.

It is an object of the present invention to provide an improved LED precursor which tackles at least one of the problems associated with prior art LEDs or, at least, provide a commercially useful alternative thereto.

SUMMARY OF THE INVENTION

The present inventors have realised that surface recombination for a Group III-nitride LED is influenced by two important mechanisms. Firstly, surface recombination may occur via crystal defects. For example, surface damage resulting from an etching process may introduce crystal defects such as vacancies or dangling bonds into an etched surface of an LED. Such crystal defects may form trap sites which facilitate non-radiative recombination events in a LED, thereby reducing IQE. Secondly, terminating the periodic crystal structure of a Group III-nitride at a surface leads to the formation of further trap levels within the energy bandgap.

According to a first aspect of the invention, a light emitting diode (LED) precursor is provided. The LED precursor comprises a substrate, a LED structure, and a passivation layer. The LED structure is provided on the substrate. The LED structure comprises a plurality of Group III-nitride layers. The plurality of Group III-nitride layers of the LED structure includes a p-type semiconductor layer, an n-type semiconductor layer, and an active layer between the p-type semiconductor layer and the n-type semiconductor layer. Each layer of the Group III-nitride layers comprises a crystalline Group III-nitride. The LED structure has a sidewall wall which extends in a plane orthogonal to a (0 0 0 1) crystal plane of the Group III-nitride layers. The passivation layer is provided on the sidewall of the LED structure such that the passivation layer covers the active layer of the LED structure. The passivation layer comprises a crystalline Group III-nitride with a bandgap higher than a bandgap of the active layer. The LED structure is shaped such that the sidewall of the LED structure is aligned with a non-polar crystal plane of each of the layers of the LED structure.

According to the first aspect of the disclosure a passivation layer is provided over at least a portion of the sidewall such that the passivation layer covers the active layer of the LED structure to ensure that the periodic crystal structure of the active layer is not terminated at the sidewall of the LED structure. Rather, the (periodic) crystalline structure of the active layer is continued by the crystalline Group III-nitride of the passivation layer. Accordingly, trap levels associated with the termination of the periodic crystal structure are not formed at the interface between the LED structure and the passivation layer. Energy levels resulting from the termination of the crystal structure are formed at a surface of the passivation layer on an opposite side to the interface with the LED structure. As such, the energy levels resulting from the termination of the crystal structure are separated from the LED structure by the passivation layer. The bandgap of the passivation layer is higher than the bandgap of the active layer such that the passivation layer reduces or prevents the flow of charge carriers from the LED structure sidewall to the surface of the passivation layer. Effectively, the passivation layer acts as a barrier layer for carriers attempting to move towards the sidewall surface of the LED structure. By reducing the number of available trap sites for charge carriers in the active layer of the LED structure the IQE of the LED structure may be increased.

Furthermore the present inventors have realised that LED structures formed from Group III-nitride crystalline materials have a polar crystalline structure. Terminating such a polar crystal structure along many planes of the structure will define a surface with a net non-zero charge. For example, a (0 0 0 1) plane of a Group III-nitride (e.g. GaN) is considered to be a polar plane. A (1 1 $\bar{2}$ 2) plane of a Group III-nitride (e.g. GaN) is considered to be a semi-polar plane. When such planes with non-zero net charge (i.e. a polar plane or a semi-polar plane) form an interface with a Group III-nitride of a higher bandgap (i.e. a passivation layer) a two-dimensional electron gas is formed at the interface between the two layers, similar to the functionality of a High Electron Mobility Transistor. For the LED structures of the present invention, formation of a two dimensional electron gas at a sidewall of an LED structure may provide a leakage path for charge carriers across the LED structure. The two dimensional electron gas formed may be sufficiently conductive so as to eliminate any advantage gained from providing a passivation layer of the LED structure.

To reduce or eliminate this phenomenon, the LED structures of the present invention are formed with a sidewall aligned with a non-polar plane of the Group III-nitride crystalline structure. By aligning the sidewall of the LED structure with a non-polar plane of the Group III-nitride crystalline structure, a two-dimensional electron gas is not formed at the interface between the LED structure and the passivation layer. Consequently, the passivation layer of the present invention ensures that a leakage path for charge carriers is not formed at the interface between the passivation layer and the LED structure. Accordingly, the present inventors have realised that by providing an LED structure with a passivation layer covering a non-polar plane sidewall results in a significant reduction in the number of trap sites present at the interface between the LED structure sidewall and the passivation layer, whilst also preventing the formation of any undesirable charge leakage paths. Therefore, LEDs resulting from the LED precursors according to the first aspect of the invention may have an increased internal quantum efficiency resulting from a reduction in the number of trap sites present at the sidewall surfaces of the active layer of the LED structure.

By the term "precursor" in LED precursor, it is noted that LED precursor described does not necessarily include the electrical contacts for the LED such as to allow the emission of light, nor the associated circuitry. Of course, the LED precursor of the first aspect does not preclude the addition of further electrical contacts and associated circuitry. As such use of the term precursor in this disclosure is intended to include the finalised product (i.e. an LED).

According to the first aspect, the LED structure comprises Group III-nitrides. Preferably the Group III-nitrides comprise one of more of AlInGaN, AlGaN, InGaN, AlN and GaN. As used herein, any reference to a species by its constituent components includes all available stoichiometries thereof. Thus, for example, AlGaN includes all alloys thereof, such as $Al_xGa_{1-x}N$ wherein x does not equal 1 or 0. Preferred stoichiometries will vary depending on the function of the specific layer.

As discussed above, in some embodiments the LED precursor may be a micro LED precursor. That is to say, the micro LED precursor according to this disclosure may be in the LED precursor having a surface area of less than 10,000 $\mu m^2$. For example, the LED precursor may have surface dimensions of less than 100 μm×100 μm.

In some embodiments, the LED structure may comprise a plurality of sidewalls, each sidewall extending orthogonally to a surface of the substrate. The LED structure may be shaped such that each sidewall of the LED structure is aligned with a non-polar crystal plane with each of the layers of the LED structure, and the passivation may be provided on each sidewall. Accordingly the passivation layer may be provided on each sidewall of the LED structure where the crystal structure of the active layer is terminated. By providing the LED structure with a passivation layer on each sidewall, the number of trap sites present at each sidewall of the active layer may be reduced without introducing further charge leakage paths, thereby increasing the IQE of the LED.

The passivation layer comprises a crystalline Group III-nitride, which in some embodiments may be comprise a single crystal (mono-crystalline) Group III-nitride or a polycrystalline Group-III-nitride. In some embodiments the passivation layer is provided on the sidewall of the LED structure such that it covers each of the plurality of layers of the LED structure. Accordingly, the passivation layer prevent or reduce the formation of trap sites resulting from the termination of the crystal lattice at the sidewalls of the p-type semiconductor layer and the sidewalls of the n-type semiconductor layer without introducing further charge leakage paths. This in turn will further increase the internal quantum efficiency of the LED structure.

In some embodiments, the LED precursor may include a current-spreading layer which extends across the surface of the substrate. The LED structure may be provided on a surface of the current-spreading layer. The current-spreading layer may comprise a Group III-nitride semiconductor. The passivation layer may also cover at least a portion of the surface of the current-spreading layer. Thus, the current-spreading layer may have a crystalline structure in which a surface of the current-spreading layer has a non-zero net charge (e.g. polar c plane, or a semi-polar plane). Accordingly, in this instance a two-dimensional electron gas may be intentionally formed at the interface between the current-spreading layer and the passivation layer (which has a bandgap higher than the active layer). This two-dimensional electron gas may improve charge carrier transport to the LED precursor (similar to a HEMT), thereby resulting in an improvement to the overall efficiency of the LED.

In some embodiments the LED precursor may have a hexagonal shape. The LED precursor may have a hexagonal shape such that sidewalls of the LED structure are aligned with the non-polar planes. In some embodiments, the LED precursor may have sidewalls which are aligned with one or more non-polar planes which may be an a-plane, or a m-plane. In some embodiments, the sidewalls of the LED structure may be aligned with a combination of a-planes and m-planes.

In some embodiments the passivation layer may comprise AlN. In some alternative embodiments the passivation layer may be a binary, ternary, quaternary, or quinary material. In some embodiments, the passivation layer may be a Group III-nitride comprising Nitrogen and one or more of B, Al, Ga or In. For example, the passivation layer may be $B_xAl_yIn_zGa_{1-x-y-z}N$, where $0\le x\le 1$, $0\le y\le 1$, $0\le z\le 1$, and $x+y+z\le 1$. Accordingly, the bandgap of the passivation layer may be varied by changing the composition of the passivation layer material in order to provide suitable functionality as a charge carrier blocking layer.

In some embodiments, the passivation layer has a thickness in a thickness direction normal to the sidewall of the LED structure of at least: 1 nm, 3 nm, or 5 nm. In some embodiments it is desirable to have a minimum thickness for the passivation layer in order to reduce charge carrier tunnelling through the passivation layer. Charge carrier tunnelling through the passivation layer may result in the occurrence of non-radiative recombination events via the energy levels on the surface of the passivation layer on the opposite side to the LED structure. Reducing, or preventing the occurrence of charge carrier tunnelling through the passivation layer will increase the amount of charge carriers available for radiative recombination, thereby further increasing IQE.

In some embodiments, the passivation layer has a thickness no greater than: 500 nm, 400 nm, or 300 nm In some embodiments of the first aspect, the bandgap of the passivation layer increases in the thickness direction away from the sidewall of the LED structure. In some embodiments, the passivation layer comprises a plurality of passivation sub-layers, the bandgap of each of the passivation sub-layers increasing in a stepwise manner in the thickness direction away from the sidewall of the LED structure. In some embodiments, the composition of the passivation layer is varied gradually in the thickness direction extending away from the sidewalls of the LED structure such that the bandgap of the passivation layer increases in the thickness direction away from the sidewall of the LED structure. The passivation layer of some embodiments may introduce some strain in the crystal lattice at the interface between the LED structure and the passivation layer. By providing a passivation layer with a varying electronic bandgap, the material properties of the bandgap may be configured to reduce strain at the interface between the LED structure and the passivation layer, whilst also providing a suitably large potential barrier to prevent the flow of charge carriers to surface states of the passivation layer.

According to a second aspect of the disclosure, an LED array precursor is provided. The LED array precursor comprises a substrate, a plurality of LED precursors provided on the substrate, and a passivation layer. Each LED structure comprises a plurality of Group III-nitride layers including a p-type semiconductor layer, an n-type semiconductor layer, and an active layer between the p-type semiconductor layer and the n-type semiconductor layer. Each of the plurality of Group III-nitride layers comprises a crystalline Group III-nitride, and each LED structure has a sidewall which extends in a plane orthogonal to a (0 0 0 1) crystal plane of the Group III-nitride layers. The passivation layer is provided on the sidewall of each LED structure such that the passivation layer covers the active layer of the LED structure. The passivation layer comprises a crystalline Group III-nitride with a bandgap higher than a bandgap of the active layer. Further, each LED structure is shaped such that the sidewall of the LED structure is aligned with a non-polar crystal plane of each the layers of the LED structure.

In some embodiments, each of the plurality of LED precursors in the LED array precursor is an LED precursor according to the first aspect of the disclosure. Accordingly, the LED array precursor of the second aspect may incorporate any of the optional features of the first aspect.

In some embodiments the LED array precursor may be comprise a plurality of micro LED precursors. That is to say, each of the micro LEDs in the LED array precursor may have a surface area of less than 10,000 μm².

The passivation layer comprises a crystalline Group III-nitride, which in some embodiments may be comprise a single crystal (mono-crystalline) Group III-nitride or a polycrystalline Group-III-nitride.

By the term "precursor" in LED array precursor, it is noted that LED array precursor described does not necessarily include the electrical contacts for each of the LEDs such as to allow the emission of light, nor the associated circuitry. Of course, the array LED precursor of the second aspect does not preclude the addition of further electrical contacts and associated circuitry. As such use of the term precursor in this disclosure is intended to include the finalised product (i.e. an LED array).

According to a third aspect of the disclosure, a method of forming an LED precursor is provided. The method comprises:

(i) providing a substrate having a surface;

(ii) depositing an LED layer on the surface of the substrate, the LED layer comprising a plurality of Group III-nitride layers including:

a p-type semiconductor layer;

an n-type semiconductor layer; and an active layer between the p-type semiconductor layer and the n-type semiconductor layer, wherein each of the Group III-nitride layers of the LED layer comprises a crystalline Group III-nitride, (iii) selectively masking the LED layer with a mask layer having at least one sidewall forming edge aligned with a non-polar plane of the LED layer (iv) etching an unmasked portion of the LED layer in a direction orthogonal to a (0 0 0 1) crystal plane of the Group III-nitride layers to form an LED structure having a sidewall aligned with the non-polar plane of the LED layer adjacent to the sidewall forming edge of the mask layer; and (v) depositing a passivation layer on the sidewall of the LED structure such that the passivation layer covers the active layer of the LED structure, the passivation layer comprising a crystalline Group III-nitride with a bandgap higher than a bandgap of the active layer.

Thus, the method according to the third aspect may provide an LED precursor according to the first aspect.

The passivation layer comprises a crystalline Group III-nitride, which in some embodiments may be comprise a single crystal (mono-crystalline) Group III-nitride or a polycrystalline Group-III-nitride.

In some embodiments, the step of etching an unmasked portion of the LED layer comprises a dry etching process followed by a wet etching process. By forming the sidewall(s) of the LED structure using a two-step etching process, a greater proportion of the LED structure surface area may etched in the direction of the (0 0 0 1) crystal plane. As such, the two-step etching process may reduce the number of trap sites present at the interface between the passivation layer and the sidewall of the LED structure.

According to a fourth embodiment of the disclosure, a method of forming an LED array precursor is provided. The method comprises:
(i) providing a substrate having a surface;
(ii) depositing an LED layer on the surface of the substrate, the LED layer comprising a plurality of Group III-nitride layers including:
a p-type semiconductor layer;
an n-type semiconductor layer; and
an active layer between the p-type semiconductor layer and the n-type semiconductor layer,
wherein each of the Group III-nitride layers of the LED layer comprises a crystalline Group III-nitride,
(iii) selectively masking the LED layer with a mask layer, the mask layer comprising a plurality of mask layer portions each having at least one sidewall forming edge aligned with a non-polar plane of the LED layer
(iv) etching unmasked portions of the LED layer in a direction orthogonal to a (0 0 0 1) crystal plane of the Group III-nitride layers to form a plurality of LED structures each having a sidewall aligned with the non-polar plane of the LED layer adjacent to the sidewall forming edge of the respective mask portion;
(v) depositing a passivation layer on the sidewall of each LED structure such that the passivation layer covers the active layer of each LED structure, the passivation layer comprising a crystalline Group III-nitride with a bandgap higher than a bandgap of the active layer.

The passivation layer comprises a crystalline Group III-nitride, which in some embodiments may be comprise a single crystal (mono-crystalline) Group III-nitride or a polycrystalline Group-III-nitride.

Accordingly, the method according to the fourth aspect may provide an LED precursor according to the second aspect. In some embodiments, the method of forming an LED array precursor may incorporate any of the features of the method of forming an LED precursor according to the third aspect of the disclosure.

BRIEF DESCRIPTION OF THE FIGURES

The invention will now be described in relation to the following non-limiting figures. Further advantages of the disclosure are apparent by reference to the detailed description when considered in conjunction with the figures, which are not to scale so as to more clearly show the details, wherein like reference numbers indicate like elements throughout the several views, and wherein:

FIG. 3b shows a simplified diagram of the electronic band structure of the active layer at the sidewall of the LED structure of FIG. 3a;

FIG. 4b shows a simplified diagram of the electronic band structure of the active layer at the sidewall of the LED structure of FIG. 4a.

DETAILED DESCRIPTION

Figure 1:
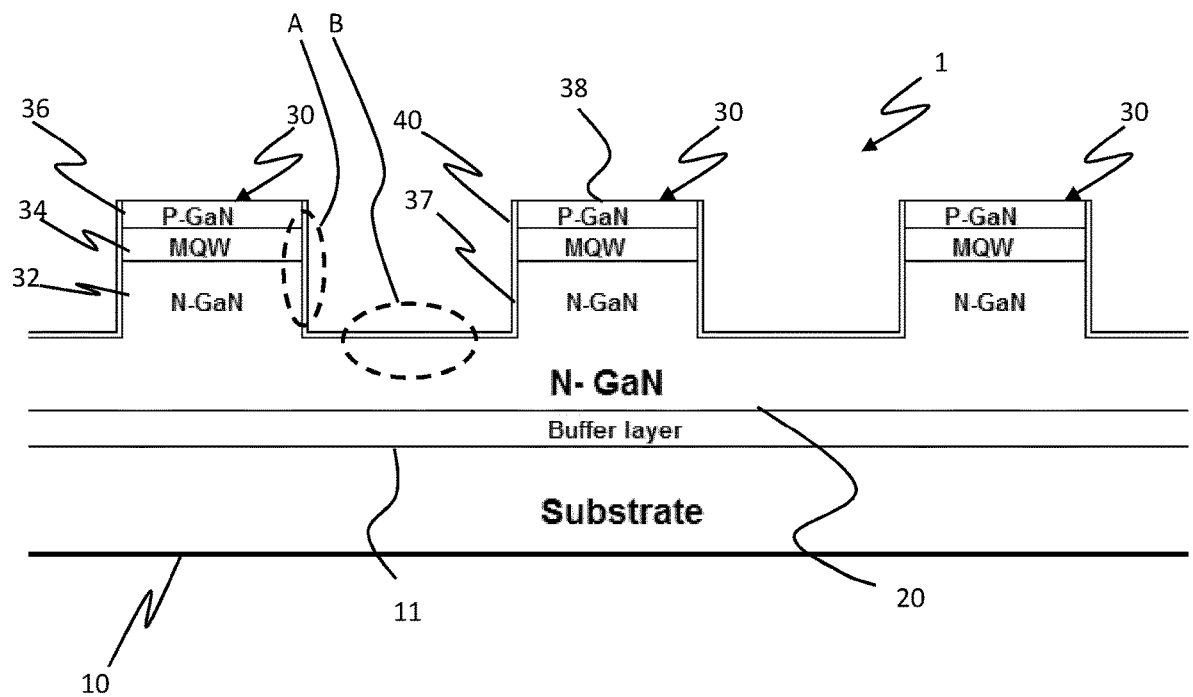
FIG. 1 shows a diagram of a LED array precursor according to an embodiment of the disclosure.

The present invention will now be further described. In the following passages different aspects of the invention are defined in more detail. Each aspect so defined may be combined with any other aspect or aspects unless clearly indicated to the contrary. In particular, any feature indicated as being preferred or advantageous may be combined with any other feature or features indicated as being optional or advantageous.

Embodiments of this disclosure describe LED precursors and methods of forming LED precursors with various structural configurations to reduce non-radiative recombination events which may occur at sidewalls of LED structures. As such, embodiments of this disclosure preferably relate to micro LED arrays and/or micro LED array precursors. Micro LED arrays are commonly defined as arrays of LEDs with a size of 100×100 $\mu m^2$ or less.

According to an embodiment of this disclosure, a LED array precursor 1 is provided. The LED array precursor 1 comprises a substrate 10, a current-spreading layer 20, and a plurality of LED structures 30. A diagram of a LED array precursor is shown in FIG. 1.

The substrate 10 provides a substrate surface 11 on which the LED structures may be provided. The substrate 10 may be any suitable substrate for fabricating Group III-nitrides thereon. For example the substrate 10 may be silicon, sapphire or Si C, wafer, or any other substrate suitable for fabrication of thin film electronics.

In the embodiment of FIG. 1, a buffer layer 14 is provided on the substrate. As shown in FIG. 1, the buffer layer 14 extends across a substrate surface 11 of the substrate 10. The buffer layer may comprise a Group III-nitride, for example AlN, AlGaN, or GaN. The buffer layer may have a thickness in the direction normal to the substrate surface 11 of at least: 100 nm, 300 nm, 500 nm, or 1000 nm.

A current-spreading layer 20 may be provided on the substrate 10, or on a buffer layer. As shown in FIG. 1 the current-spreading layer 20 extends across the buffer layer 14 on a surface of the buffer layer 14 opposite the substrate surface 11 of the substrate 10. The LED structures 30 are distributed across a surface of the current-spreading later 20 on the opposing side of the current-spreading layer 20 to the substrate 10.

The substrate 10 may comprise a sapphire or silicon wafer. Although in FIG. 1 the substrate 10 is shown as a single block, it will be appreciated that the substrate 10 may comprise a plurality of layers. For example, the substrate 10 may comprise a plurality of active matrix electronic layers for driving the LED precursors in addition to a silicon wafer.

A plurality of LED structures 30 are provided on the current-spreading layer 20. The plurality of LED structures 30 may be distributed across the current-spreading layer 20 in order to form a two-dimensional array. Although the embodiment of FIG. 1 is an LED array precursor 1 comprising a plurality of LED structures 30, it will be appreciated that in other embodiments an individual LED structure 30 may be provided on a substrate 10.

Each LED structure 30 comprises a plurality of layers. In the embodiment of FIG. 1, each LED structure 30 comprises an n-type semiconducting layer 32, an active layer 34, and a p-type semiconducting layer 36. Each LED structure 30 is provided on the surface of the current-spreading layer 20 on an opposite side of the current-spreading layer 20 to the substrate 10. The plurality of layers 32, 34, 36 are stacked upon each other to form the LED structure 30. As such the LED structure 30 extends in a direction normal to the surface of the current-spreading layer 20 and the substrate surface 11. Each of the layers 32, 34, 36 of the LED structure 30 is formed from a crystalline Group III-nitride. As such, the LED structure 30 has a crystalline structure. As shown in FIG. 1 the LED structure 30 is a mesa structure which extends from the surface of the current spreading layer 20.

The LED structures 30 shown in FIG. 1 are mesa-shaped structures which extend in a direction generally transverse to the substrate surface 11. As such, the LED structures of FIG. 1 include a plurality of generally planar surfaces. The plurality of generally planar surfaces includes a plurality of sidewalls 37, and a light emitting surface 38. The light emitting surface 38 is a surface of the LED structure 30 opposite the substrate 10.

In the embodiment of FIG. 1, the (0 0 0 1) crystal planes of the LED structures are parallel to the substrate surface 11. Accordingly, the surface of the sidewall 37 is orthogonal to the (0 0 0 1) crystal planes of the LED structure and the substrate surface 11. The sidewalls 37 of the LED structure 30 are the surfaces of the LED structure 30 extending between the substrate surface 11 (or current spreading layer 20) and the light emitting surface 38. As shown in FIG. 1, the sidewalls 37 of the LED structures 30 are also orthogonal to the surface of the current spreading layer 20 over which the LED structures 30 are provided. Of course, it will be appreciated in some embodiments, the current spreading layer may be optional, or the current spreading layer may have an upper surface which is not planar.

The n-type semiconducting layer 32 may be any Group III-nitride. For example, in the embodiment of FIG. 1, the n-type semiconducting layer 32 may be formed from GaN. The n-type semiconductor layer 32 may be doped, for example with Si or Ge impurities, or any other suitable electron donor. The n-type semiconductor layer 32 may be formed on the current spreading layer 20 such that it is in electrical contact with the current spreading layer 20.

Figure 2:
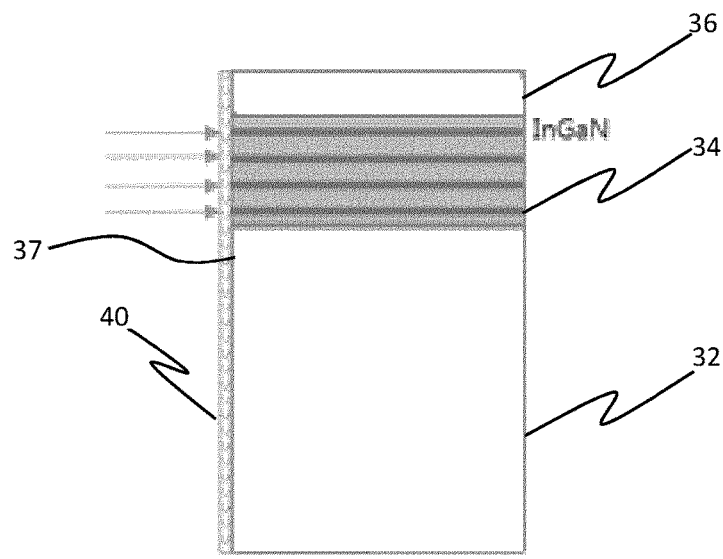
FIG. 2 shows a side view of an LED structure according to an embodiment of the disclosure.

The active layer 34 may comprise one or more quantum wells for the generation of photons. The quantum wells may be formed from a plurality of layers of Group III-nitrides with different bandgaps. In some embodiments, a Group III-nitride alloy including In may be used to form a quantum well. Multiple quantum well active layers for LEDs comprising Group-III nitrides are known to the skilled person. FIG. 2 shows one example of an active layer 34 comprising alternating layers of GaN and InGaN. The InGaN layers used to form the quantum wells are relatively thin compared to the thickness of the GaN layers. Thus, the bandgap of the active layer 34 is considered to be the largest bandgap 34 of the layer. For the embodiment of FIG. 2, the bandgap of the active layer 34 is the bandgap of the GaN layers: 3.4 eV.

The p-type semiconducting layer 36 may comprise any Group III-nitride which is doped with an electron acceptor, for example, Mg. In the embodiment of FIG. 1, the p-type semiconducting layer 36 may be Mg doped GaN.

The current spreading 20 layer may comprise a Group III-nitride. The current spreading layer 20 may be formed from the same material as the n-type semiconducting layer. For example, in the embodiment of FIG. 1, the current spreading layer 20 may be formed from GaN. In some embodiments, the GaN current spreading layer 20 may be undoped GaN. In other embodiments, the GaN current spreading layer 20 may include some n-type dopants, similar to the n-type semiconductor layer 32.

The passivation layer 40 may comprise a crystalline Group III-nitride with a higher bandgap than the active layer 34. The crystalline Group III-nitride passivation layer 40 may comprise a single crystal (mono-crystalline) Group III-nitride passivation layer or a polycrystalline Group III-nitride passivation layer. The crystal structure of the passivation layer is configured to generally match the crystal structure of the Group III-nitride layers forming the sidewall 37 of the LED structure 30. As such, the periodic crystal structure is generally not interrupted by the transition from the LED structure 30 to the passivation layer 40 across the sidewall interface. Of course, it will be appreciated that due to the different molecular compositions of the passivation layer compared to the LED structure 30, there may be a small amount of lattice strain at the interface between the passivation layer 40 and the LED structure 40 at the sidewall. Such strain may result in some dislocations being present at the sidewall 37. However, it will be appreciated that energy levels in the energy band resulting from such dislocations are typically located much deeper in the energy band and may be present at a lower density than the trap sites resulting from the termination of the crystal lattice In the embodiment of FIG. 1, passivation layer comprises AlN. AlN typically has a bandgap of about 6 eV, which is higher than the bandgap of the active layer. In other embodiments, the passivation layer may be formed from a Group III-nitride including one or more of: B, Al, Ga, and In. For example, the passivation layer may be $B_xAl_yIn_zGa_{1-x-y-z}N$, where $0 \leq x \leq 1$, $0 \leq y \leq 1$, $0 \leq z \leq 1$, and $x+y+z \leq 1$.

The passivation layer 40 may be formed with a thickness of at least 1 nm. The thickness of the passivation layer 40 is considered to be the thickness of the layer in the direction normal to the surface of the sidewall 37 of the LED structure 30. In some embodiments, the thickness of the passivation layer may be at least 3 nm, or 5 nm. In order to reduce or eliminate tunnelling of charge carriers from the LED structure 30 through the passivation layer to the surface states 39, it may advantageous to provide the passivation layer with a minimum thickness as discussed herein.

The passivation layer 40 may be formed with a thickness of no greater than: 500 nm, 400 nm, or 300 nm. In order to not limit the pixel density of a matrix of LEDs, it may be advantageous to limit the thickness of the passivation layer 40.

In some embodiments, an insulating layer may be deposited over the passivation layer. the insulating layer may comprise $Al_2O_3$, $SiO_2$ or $SiN_x$. The insulating layer may be provided to fill in any gaps or voids between the LED structures such that the LED array precursor can be planarised. As such, the insulating layer may be a gap-filling insulating layer.

Figure 3A:
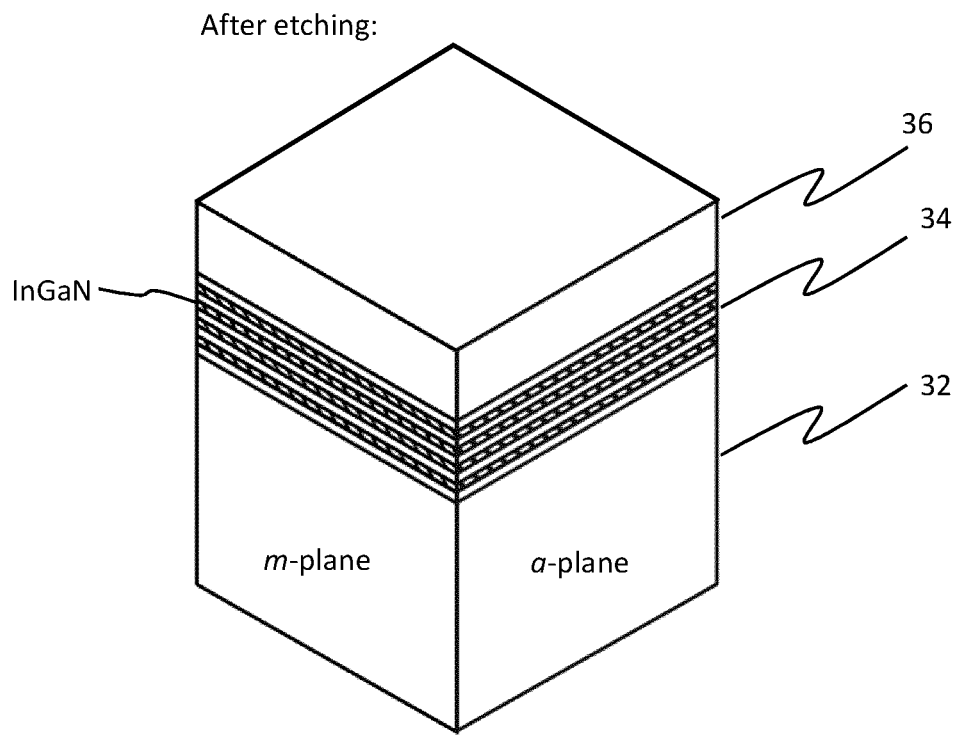
FIG. 3a shows an isometric diagram of an LED structure according to an embodiment of the disclosure.
Figure 3B:
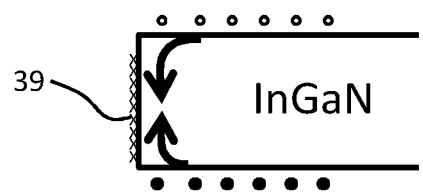

FIG. 3a shows an isometric view of an LED structure 30 without a passivation layer. As shown in FIG. 3a, a sidewall 37 of the LED structure 30 is aligned with an m-plane of the crystal structure of the LED structure 30 and an adjacent sidewall 37 of the LED structure 30 is aligned with an a-plane of the LED structure 30. FIG. 3b shows a simplified diagram of the electronic band structure of the active layer 32 at the sidewall 37 of the LED structure 30. As the sidewall 37 is not passivated, the trap sites resulting from the termination of the crystal structure, as well as trap sites resulting from crystal defects are present at the surface of the sidewall 37 These trap sites may trap charge carriers (electrons $e^-$ and holes $h^+$). Consequently, non-radiative recombination may occur via trap sites 39 as indicated by the arrows in FIG. 3b.

Figure 4A:
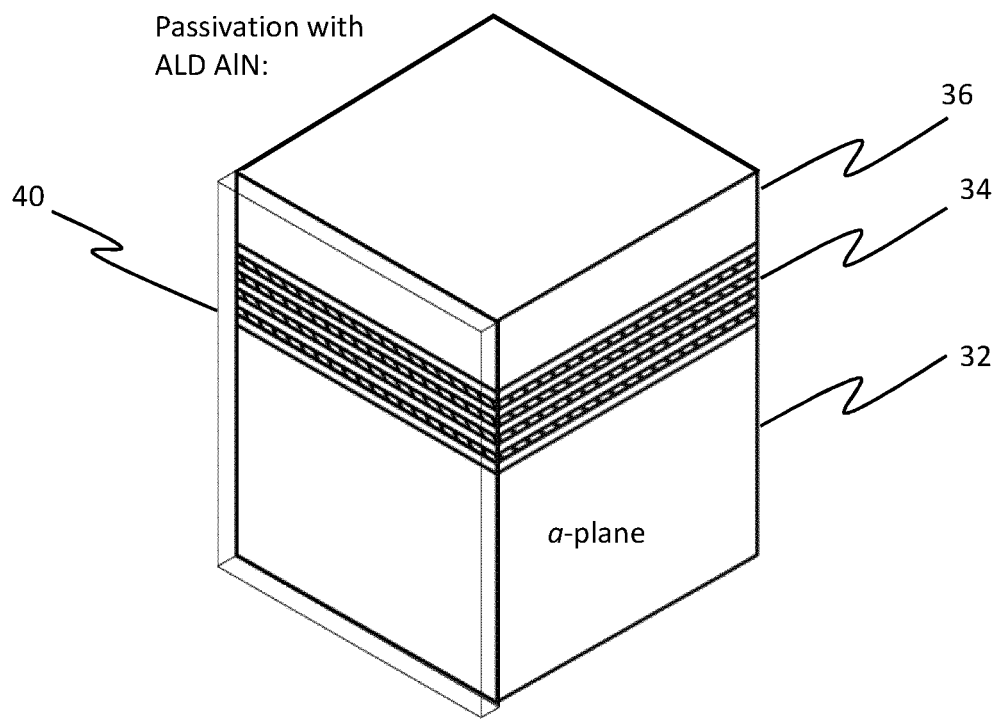
FIG. 4a shows an isometric diagram of an LED structure and a passivation layer according to an embodiment of the disclosure.

FIG. 4a shows an isometric view of an LED structure 30 with a passivation layer 40. As shown in FIG. 4a, the sidewall 37 of the LED structure 30 is aligned with an m-plane of the crystal structure of the LED structure 30.

Figure 4B:
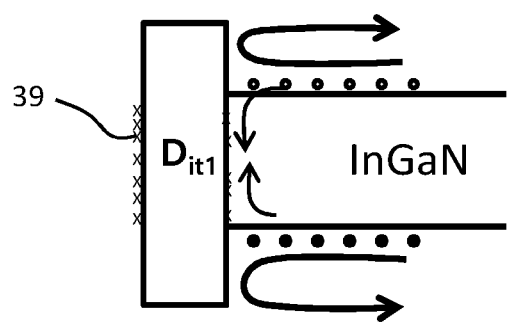

FIG. 4b shows a simplified diagram of the electronic band structure of the active layer 32 at the sidewall 37 of the LED structure 30. Surface trap sites 39 resulting from the termination of the crystal lattice are formed on the outer surface of the passivation layer 40 as shown in FIG. 4b. The AlN passivation layer 40 has a bandgap which is greater than the bandgap of the InGaN active layer 34. The bandgaps are aligned such that the passivation layer 40 acts as a barrier to the flow of charge carriers from the active layer conduction and valence bands to the surface trap sites 39. As shown in FIG. 4b, some trap sites may still be present at the interface between the passivation layer 40 and the LED sidewall 37 resulting from defects in the crystal structure, and also any strain (i.e. dislocations) that may exist between the passivation layer and the LED structure. However, the remaining trap sites are typically located much deeper in the energy band and may be present at a lower density than the trap sites resulting from the termination of the crystal lattice (i.e. as shown in FIG. 3b). As such, the provision of a passivation layer 40 according to embodiments of this disclosure reduces the presence of trap sites at the sidewall 37 of the LED structure relative to an un-passivated sidewall (e.g. as shown in FIG. 3b). Thus, providing a passivation layer 40 on the sidewall surface of an active layer 34 reduces the rate of non-radiative recombination events occurring in the LED structure 30.

Figures 5A, 5B, 5C:
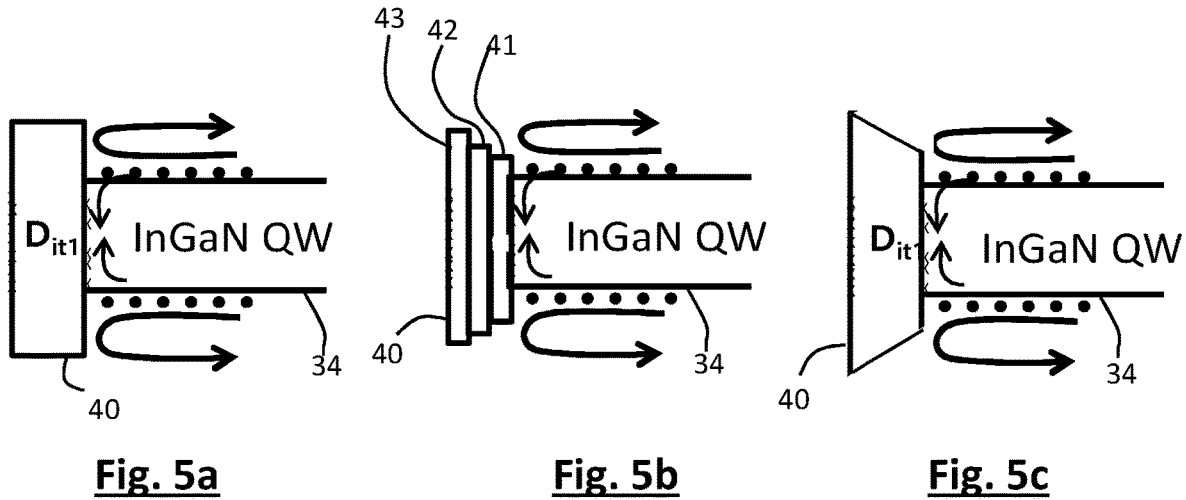
FIGS. 5a, 5b, and 5c shows simplified diagrams of the electronic band structure for three passivation layers according to embodiments of the disclosure.

FIGS. 5a, 5b, and 5c show simplified electronic band structures for three different passivation layers 40 according to embodiments of this disclosure. FIG. 5a shows an embodiment in which a single Group III-nitride material layer is the passivation layer 40. As such, the embodiment of FIG. 5a is similar to the electronic band structure of FIG. 4b in which the passivation layer 40 is provided by an AlN layer.

FIG. 5b shows the electronic band structure for a passivation layer 40 comprising a plurality of passivation layers 41, 42, 43. Each of the passivation layers 41, 42, 43 is formed from a Group III-nitride having a bandgap higher than the bandgap of the active layer 34. As shown in FIG. 5b, the bandgap of each of the passivation layers 41, 42, 43 increases in a stepwise manner in the thickness direction away from the sidewall of the LED structure. In some embodiments, the passivation layer 41, 42, 43 may each be formed from $Al_xGa_{1-x}N$, wherein $0 \leq x \leq 1$. In order to vary the bandgap for each of the layers, the relative amount of Al may be varied for different layers. In other embodiments, other Group III-nitride semiconductors comprising one or more of: B, Al, Ga, and In may be used to form the plurality of passivation layers 41, 42, 43. In the embodiment of FIG. 5b, three passivation layers are provided, although in other embodiments, at least: 2, 3, 4 or 5 passivation layers may be provided.

FIG. 5c shows the electronic band structure for a passivation layer 40 comprising a graded bandgap passivation layer. As such, the bandgap of the passivation layer increases in the thickness direction away from the sidewall of the LED structure. For example, the passivation layer 40 may be formed from $Al_xGa_{1-x}N$, wherein $0 \leq x \leq 1$. In order to provide a graded bandgap, the relative amount of Al in the layer may be increased in the thickness direction away from the sidewall of the LED structure (i.e. x increases in the thickness direction away from the sidewall of the LED structure).

In some embodiments, it may be advantageous to provide a passivation layer which has a bandgap which increases in the thickness direction away from the sidewall of the LED structure.

Figure 6:
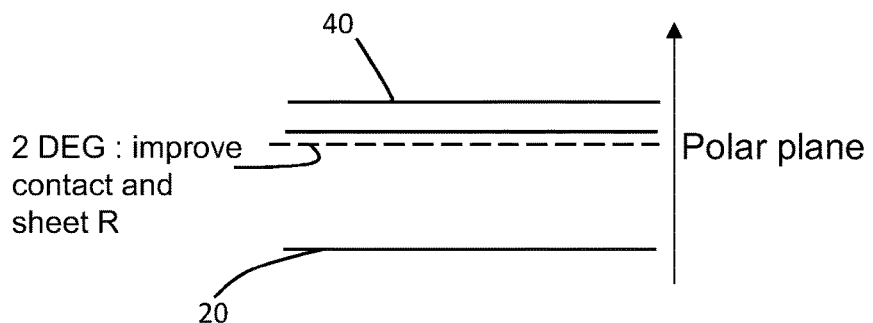
FIG. 6 shows a detailed sectional view detail of portion B shown in FIG. 1.

FIG. 6 shows a detailed sectional view detail of portion B shown in FIG. 1. FIG. 6 shows the interface formed between the current spreading layer 20 and the passivation layer 40. As discussed above, the exposed upper surface of the current spreading layer 20 may be aligned with a polar plane of the crystal structure of the Group III-nitride of the current spreading layer 20. Consequently, a two dimensional electron gas may be formed at the interface between the passivation layer 40 and the current spreading layer 20. The presence of a two-dimensional electron gas at this interface may reduce sheet resistance of the LED array, thereby improving the efficiency of the LED array.

Figure 7:
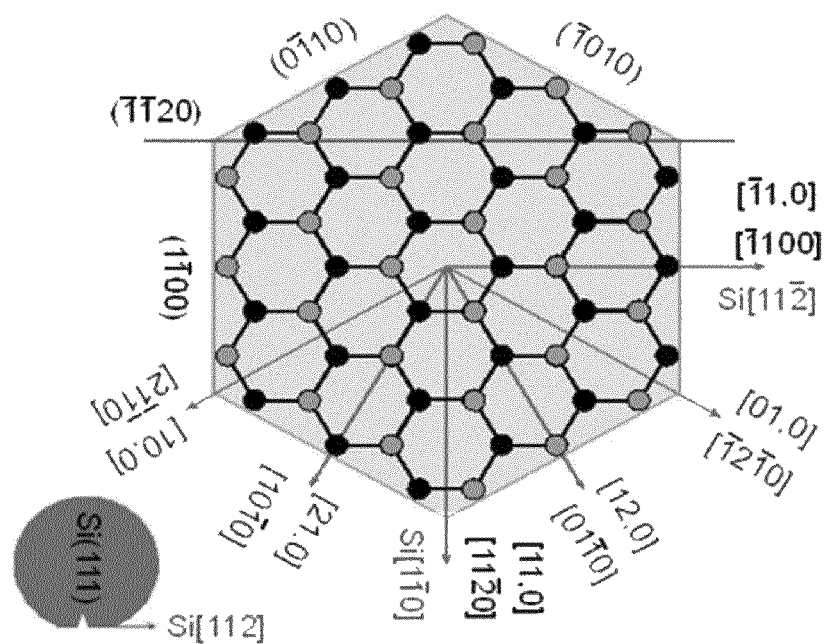
FIG. 7 shows a diagram representative of the crystal structure of a Group III-nitride.

As discussed above, according to embodiments of this disclosure, the sidewalls 37 of the LED structures 30 to be passivated are aligned with non-polar crystal planes of LED structure 30. FIG. 7 shows a diagram representative of the crystal structure of a Group III-nitride. FIG. 7 shows the crystal structure of a c plane ((0 0 0 1) plane) of a Group III-nitride semiconductor. It is important that the sidewalls 37 of the LED structure 30 to be passivated are aligned with non-polar crystal planes of the LED structure 30 in order to ensure that a two-dimensional electron gas is not formed at the interface. The formation of a two-dimensional electron gas at the interface will provide a leakage path for charge carriers across the LED junction. Such leakage paths will reduce the efficiency of the LED. Consequently, the passivation layer 40 of the present invention ensures that a leakage path for charge carriers is not formed at the interface between the passivation layer 40 and the LED structure 30.

In some embodiments, the LED structures 30 may be fabricated on crystalline substrates of a known crystal orientation in order to provide LED structures 30 with a known crystalline orientation. For example, as shown in FIG. 7, the diagram is representative of the crystal structure of a Group III-nitride semiconductor fabricated on the surface of a Si wafer. The surface of the Si wafer is aligned with a (1 1 1) Si crystal plane. The LED structure 30 may be fabricated on the Si wafer such that the c plane of the Group III-nitride is aligned with the (1 1 1) plane of the Si wafer.

As shown in FIG. 7, the crystal orientation of the (1 1 1) plane of the Si wafer may also be known. For example, the [1 1 2] direction of the Si crystal may be identified on the Si wafer. Consequently, the orientation of the Group III-nitride crystal provided on the Si wafer may also be known by reference to the orientation of the Si wafer. Consequently, the LED structures 30 may be fabricated such that the sidewalls 37 are aligned with non-polar crystal planes. FIG. 7 shows one example of a (0 0 0 1) crystal plane of a Group III-nitride in which each of the edges are aligned with non-polar crystal planes.

Figure 8:
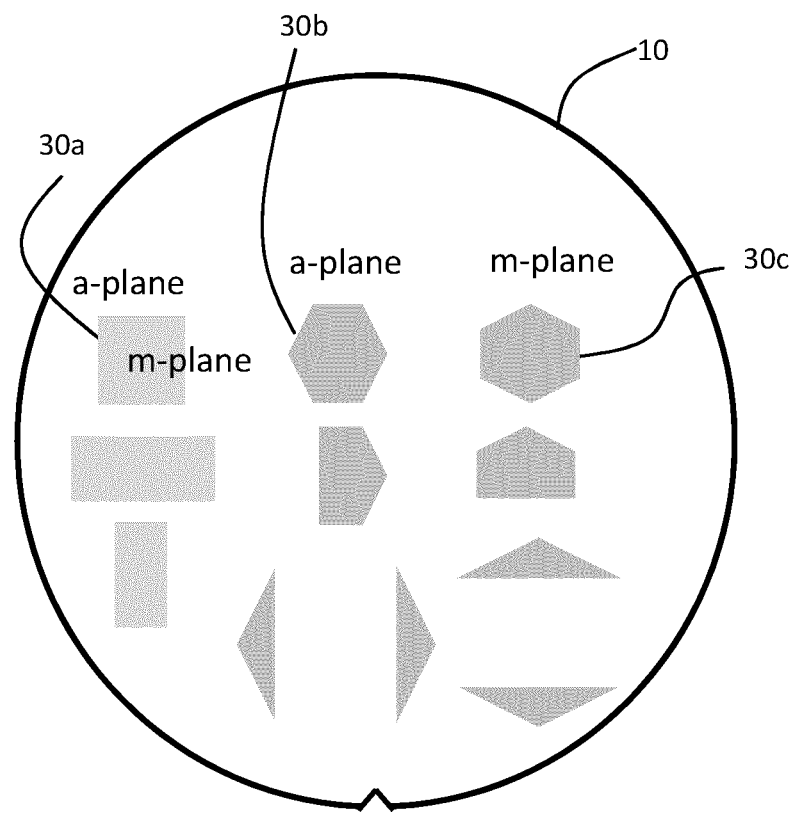
FIG. 8 shows a plan view of three different shaped LED structures formed on a Si wafer substrate.

FIG. 8 shows a plan view of a plurality of different shaped LED structures 30 formed on a Si wafer substrate 10. Each LED structure 30 has sidewalls 37 extending normal to the substrate surface 11. Each of the LED structures 30 has sidewalls 37 which are aligned with non-polar crystal planes of the LED structure 30. The LED structures may be shaped to be regular polygons in plan view, such as LED structures 30a, 30b, 30c. The first LED structure 30a has four sidewalls 37 wherein each sidewall is perpendicular to adjacent sidewalls. As such, the LED structure 30a has a cuboidal shape. As shown in FIG. 8, two of the sidewalls 37 of the first LED structure are aligned with a-planes of the Group III-nitride crystal structure while the other two sidewalls are aligned with m-planes. The second LED structure 30b has six sidewalls 37, each sidewall being aligned with an a-plane of the Group III-nitride crystal structure. As such, the second LED structure 30b has a hexagonal shape when viewed in a plane view (i.e. the (0 0 0 1) plane has a hexagonal cross section). The third LED structure 30c has six sidewalls 37, each sidewall being aligned with an m-plane of the Group III-nitride crystal structure. As such, the third LED structure 30c has a hexagonal shape when viewed in a plan view (i.e. the (0 0 0 1) plane has a hexagonal cross section). Of course, it will be appreciated that the present disclosure also extends to LED structures 30 having sidewalls aligned with different combinations of a-planes and m-planes (i.e. irregular-shaped polygons when viewed in plan view). A number of examples of such shapes are shown in FIG. 8

Figure 9:
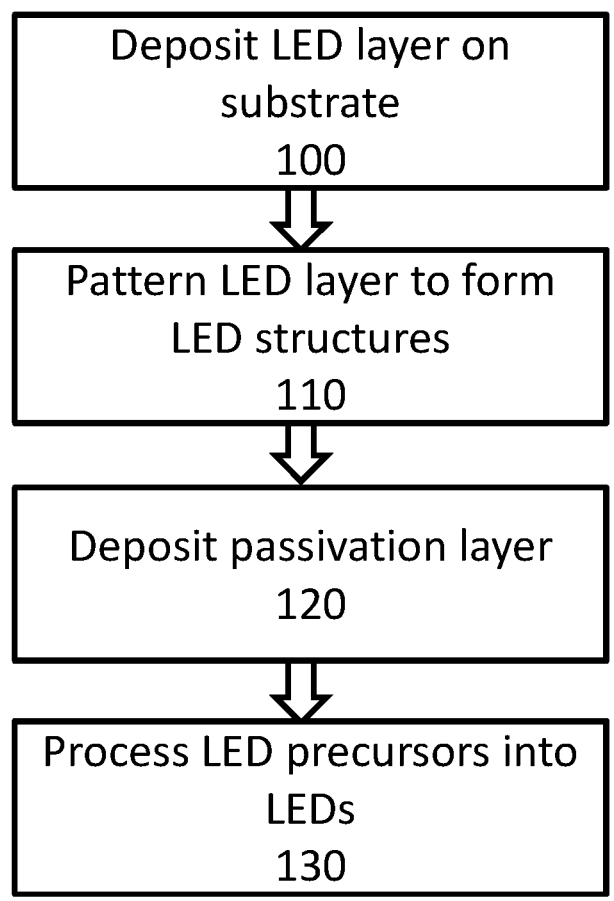
FIG. 9 is a flow chart of a method of manufacturing an array of LED precursors according to the embodiment of FIG. 1.

Next, a method of manufacturing an LED precursor according to embodiments of this disclosure will be described. FIG. 9 is a flow chart of a method of manufacturing an array of LED precursors according to the embodiment of FIG. 1.

Firstly, a substrate 10 is provided. The substrate may be a Si wafer, a sapphire wafer, or any other suitable substrate for the fabrication of thin film electronics. The substrate surface 11 may have a known crystal orientation such that the crystal orientation of the Group III-nitrides formed on the substrate surface 11 also have a known crystal orientation. For example, as shown in FIG. 7, a Si wafer with a (1 1 1) crystal orientation may be used. Other substrates, or substrate coatings, for controlling the orientation of Group III-nitrides may also be suitable.

A buffer layer 14 may be formed on the substrate surface 11. The buffer layer 14 may be formed over a substantial portion of the substrate surface 11. The buffer layer may be comprise a Group III-nitride, for example AlN or GaN. The buffer layer may provide a surface for the epitaxial growth of further Group III-nitride layers. The buffer layer may be deposited using Metal Oxide Chemical Vapour Deposition (MOCVD), Molecular Beam Epitaxy (MBE), or Atomic Layer Deposition (ALD).

A current spreading layer 20 may be formed on the buffer layer 14. The current spreading layer 20 may be formed over a substantial portion of the buffer layer 14. In other embodiments, other electronics layers, such as active matrix electronics layers and the like, may also be formed on the substrate surface, or be provided as part of the substrate.

Next, an LED layer is formed (step 100) on the current spreading layer 20. In other embodiments, the LED layer may be formed on the substrate surface 11 directly. The LED layer may comprise a plurality of Group III-nitride layers for forming LED structures. As such, the LED layer may comprise all the layers that are to be included in the LED structure 30 according to embodiments of this disclosure. For example, to form the LED structure 30 in the embodiment of FIG. 1, the LED layer may include an n-type semiconducting layer 32, an active layer 34, and a p-type semiconducting layer 36 as discussed above for FIG. 1.

Once the LED layer is formed, the LED layer is patterned to form a plurality of LED structure 30 (step 110) as shown in FIG. 1. The LED structures 30 formed include sidewalls 37 which are aligned with non-polar planes of the LED structures 30.

A passivation layer 40 is then formed on the sidewalls of the LED structure 30 (step 120) such that the passivation layer covers at least the active layer of each LED structure. As discussed above, the passivation layer comprises a Group III-nitride with a bandgap higher than a bandgap of the active layer for each LED structure 30.

Once each of the LED structures 30 is passivated, further processing steps (130) may be carried out as required to make suitable electrical contacts to each of the LED precursors. Further encapsulating layers may also be deposited over the LED precursors as required.

Figure 10:
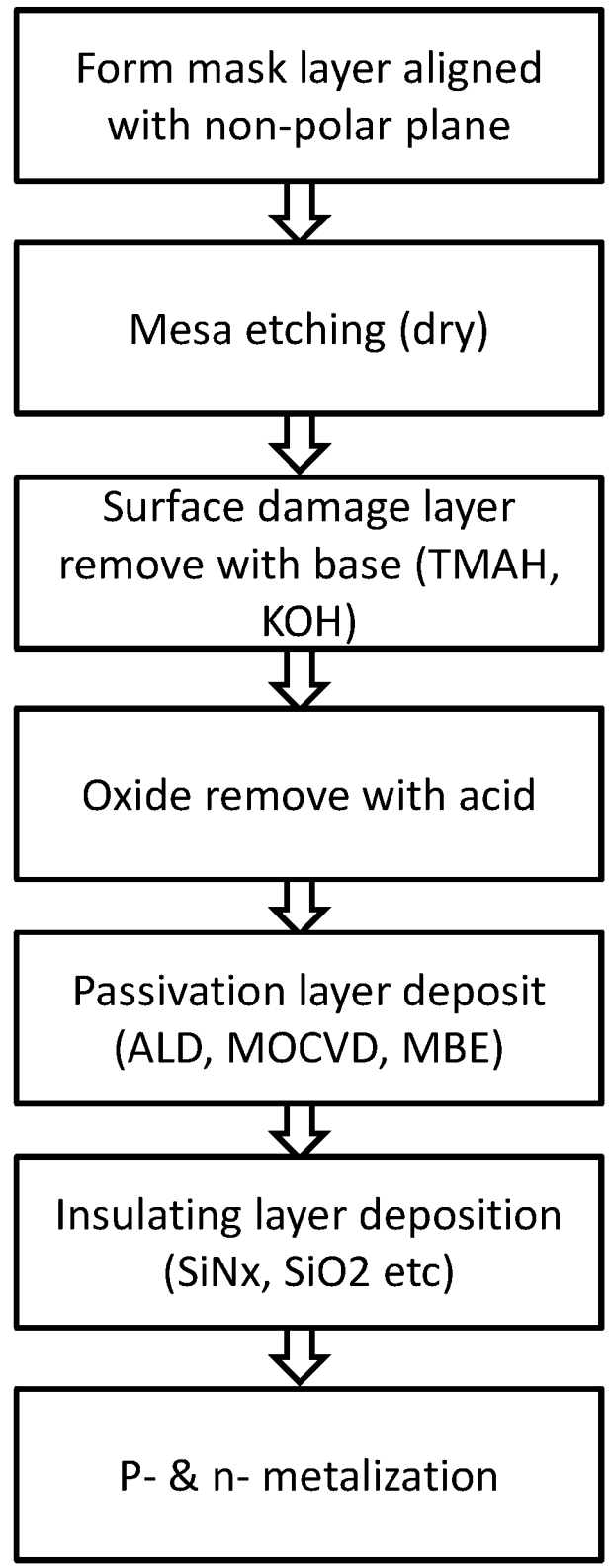
FIG. 10 is a flow chart of a method for patterning the LED layer and depositing the passivation layer according to an embodiment of the disclosure.

One method for patterning the LED layer and depositing the passivation layer is described in more detail in the flow chart of FIG. 10.

In order to pattern the LED layer, a mask layer may be used selectively mask portions of the LED layer in order to define a shape for each of the LED structures 30 to be formed. The mask layer may be formed from any suitable layer known in the art. For example, the mask layer may comprise a $SiO_2$ layer or other suitable masking material. The mask layer may have a thickness of around 50 nm to 1000 nm. The mask layer may be patterned using any suitable patterning method, for example a lithographic patterning step.

The mask layer may be patterned to form a shape on the LED layer include mask edges. The mask layer is aligned with the crystal structure of the LED layer such that the mask edges are aligned with non-polar planes of the LED layer. For example, the mask layer may be patterned to include a plurality of rectangular shaped or hexagonal shaped mask portions. As discussed above in relation to FIGS. 7 and 8, each of the mask edges of a rectangular or hexagonal shaped mask portion may be aligned with the a-plane and/or m-plane (i.e. non-polar planes) of the Group III-nitride crystal structure of the LED layer.

The LED structures 30 may be formed through an etching process. The etching process selectively removes the unmasked portions of the LED layer to leave behind a plurality of LED structures. As such, the LED structures 30 formed by the etching process are mesa structures. In order to form the LED structures 30 with sidewalls 37 aligned with non-polar planes of the Group III-nitride crystal structure, the etching process is designed to etch the sidewalls of the LED structure in a direction orthogonal to the (0 0 0 1) crystal plane of the Group III-nitride layers of the LED layer. In some embodiments, an anisotropic etching process may be used to etch the designed to etch the sidewalls of the LED structure in a direction orthogonal to the (0 0 0 1) crystal plane of the Group III-nitride layers of the LED layer.

According to the method of FIG. 10, the LED layer is first etched with a dry etching process. For example, a plasma etching process in a low pressure environment may be advantageous for providing LED structures with sidewalls 37 orthogonal to the (0 0 0 1) crystal plane of the LED layer.

In some embodiments, the dry etching process may be supplemented with a wet etching process. The wet etching process may be provided to remove any surface damage introduced during the dry etching process. As such, the wet etching process may reduce the amount of defects (dangling bonds, vacancies) present at the sidewall 37 of the LED structure 30. The wet etching process may also increase the proportion of the LED surface area which is planar sidewall 37 aligned with a non-polar plane of the LED structure 30.

The wet etching process may use an etchant such as tetramethylammonium hydroxide (TMAH) or KOH. Such a wet etching process may be particularly suited for anisotropic etching of Group III-nitride crystal structures to provide sidewalls 37 which are orthogonal to the (0 0 0 1) crystal plane. Following the wet etching process, a further wet-etching step may be performed to remove any oxide layer formed on the sidewall 37 surfaces of the LED structure 30 resulting from the wet etching process. The further wet-etching step may comprise etching any oxide formed using HCl, or any other suitable etchant. As such, the wet etching process may be a two-step process comprising a first wet etching step and a second wet etching step. The first wet etching step may be an oxidising etching step, while the second wet etching step may be a reducing etching step. Further details of a suitable etching process for etching the sidewalls of the LED structure in a direction orthogonal to the (0 0 0 1) crystal plane may be found in Li et al, GaN-based Ridge Waveguides with Very Smooth and Vertical Sidewalls by ICP Dry Etching and Chemical Etching, pp. Jth2A.24, Optical Society of America, 2015.

Once the LED structures 30 have been formed with suitably aligned sidewalls 37, the passivation layer 40 may be formed on the sidewalls 37 of the LED structures 30. In the embodiment of FIG. 1, the passivation layer 40 comprises AlN. The passivation layer 40 may be deposited using any suitable method for depositing Group III-nitrides, for example Metal Oxide Chemical Vapour Deposition (MOCVD), Molecular Beam Epitaxy (MBE), or Atomic Layer Deposition (ALD). The passivation layer 40 may have a crystalline, or a polycrystalline structure. The precise methodology for depositing the passivation layer 40 may depend on the geometry of the LED structure 40 to be passivated.

In the embodiment of FIG. 1, the passivation layer is deposited such that is covers all of the sidewall surfaces 37 of the LED structure 30. As shown in FIG. 1, the passivation layer does not cover the light emitting surface 38 of the LED structure 30. The passivation layer 40 also covers the exposed surface of the current spreading layer 20 between the LED structures 30.

In accordance with the embodiment shown in FIG. 5b, the passivation layer 40 may be deposited in a plurality of deposition steps. In some embodiments, deposition of the passivation layer 40 in a plurality of deposition steps may reduce the likelihood of cracks forming in the passivation layer 40. The formation of cracks in the passivation layer 40 may provide leakage paths between the LED structure 30 and the surface of the passivation layer 40.

Each deposition step may deposit a passivation sub-layer 41, 42, 43. Each of the passivation sub-layers 41, 42, 43 may be formed from a Group III-nitride having a bandgap higher than the bandgap of the active layer 34. As discussed above for FIG. 5b, the composition of each passivation sub-layer deposited in each step may be varied in order to vary the bandgap of the passivation sub-layer 41, 42, 43.

For example, in some embodiments, it may be desirable to deposit a first passivation sub-layer comprising AlN with a thickness of no greater than 4 nm. By limiting the thickness of the first passivation sub-layer which forms the interface with the sidewalls 37 of the LED structure 30 to no greater than 4 nm, the likelihood of cracks forming in the passivation layer 40 may be reduced or eliminated. Further passivation sub-layers 42, 43 may then be deposited on the first passivation sub-layer comprising AlN, to increase the thickness of the passivation layer 40, thereby reducing the effect of charge carrier tunnelling. For example, the further passivation sublayers 42, 43 may comprise $B_xAl_yIn_zGa_{1-x-y-z}N$, where $0 \leq x \leq 1$, $0 \leq y \leq 1$, $0 \leq z \leq 1$, and $x+y+z \leq 1$.

In accordance with the embodiment shown in FIG. 5c, the passivation layer 40 may be deposited including a deposition step in which to composition of the Group III-nitride is varied during the deposition process. For example, in order to provide a graded bandgap, the relative amount of Al deposited may be increased over the course of the deposition process. Accordingly, the passivation layer 40 deposited may have a bandgap which increases in the thickness direction away from the sidewall of the LED structure. Varying the relative amount of Al present in the passivation layer 40 thorough its thickness may reduce any strain formed at the interface between the passivation layer 40 and the sidewall 37.

Once the passivation layer 40 is deposited, an LED array precursor 1 according to embodiments of the disclosure may be provided. The LED array precursor may be subjected to further fabrication steps, such as the deposition of an insulating layer. The insulating layer may be deposited by any suitable deposition method, for example by Chemical Vapour Deposition (CVD).

The LED array precursor 1 may also have further electrical contacts deposited on to it in order to form an LED array. For example, electrical contacts to the p and n sides of each LED array may be deposited by metal lift-off, metal etching, Cu electroplating, or any other known method for fabricating thin film circuitry.

Although preferred embodiments of the invention have been described herein in detail, it will be understood by those skilled in the art that variations may be made thereto without departing from the scope of the invention or of the appended claims.

The invention claimed is:

1. A light emitting diode (LED) precursor comprising:
   a substrate;
   an LED structure provided on the substrate comprising a plurality of Group III-nitride layers including:
   a p-type semiconductor layer;
   an n-type semiconductor layer; and
   an active layer between the p-type semiconductor layer and the n-type semiconductor layer,
   wherein each of the plurality of Group III-nitride layers comprises a crystalline Group III-nitride,
   the LED structure having a sidewall which extends in a plane orthogonal to a (0 0 0 1) crystal plane of the Group III-nitride layers;
   a passivation layer provided on the sidewall of the LED structure such that the passivation layer covers the active layer of the LED structure, the passivation layer comprising a crystalline Group Ill-nitride with a bandgap higher than a bandgap of the active layer;
   wherein
   the LED structure is shaped such that the sidewall of the LED structure is aligned with a non-polar crystal plane of each the Group Ill-nitride layers of the LED structure.

2. A light emitting diode precursor according to claim 1, wherein
   the LED structure comprises a plurality of sidewalls, each sidewall extending orthogonally to a surface of the substrate,
   the LED structure is shaped such that each sidewall of the LED structure is aligned with a non-polar crystal plane of each the Group Ill-nitride layers of the LED structure, and
   the passivation layer is provided on each sidewall.

3. A light emitting diode precursor according to claim 1, wherein
the passivation layer is provided on the sidewall of the LED structure such that it covers each of the of Group III-nitride layers of the LED structure.

4. A light emitting diode precursor according to claim 1, further comprising
a current spreading layer extending across the surface of the substrate, the LED structure provided on a surface of the current spreading layer, the current spreading layer comprising a Group III-nitride semiconductor, wherein
the passivation layer also covers at least a portion of the surface of the current spreading layer.

5. A light emitting diode precursor according to claim 1, wherein the LED structure is shaped such that each sidewall of the LED structure is aligned with an a-plane or an m-plane of the crystalline Group III-nitride layers of the LED structure.

6. A light emitting diode precursor according to claim 1, wherein the passivation layer comprises $B_xAl_yIn_zGa_{1-x-y-z}N$, where $0 \leq x \leq 1, 0 \leq y \leq 1, 0 \leq z \leq 1$, and $x+y+z \leq 1$.

7. A light emitting diode precursor according to claim 1, wherein the passivation layer has a thickness in a thickness direction normal to the sidewall of the LED structure of at least: 1 nm; and/or the passivation layer has a thickness no greater than: 500 nm.

8. A light emitting diode precursor according to claim 1, wherein the bandgap of the passivation layer increases in the thickness direction away from the sidewall of the LED structure.

9. A light emitting diode precursor according to any preceding claim 1, wherein the passivation layer comprises a plurality of passivation sub-layers, the bandgap of each of the passivation sub-layers increasing in a stepwise manner in the thickness direction away from the sidewall of the LED structure.

10. A light emitting diode precursor according to claim 1, wherein the composition of the passivation layer is varied gradually in the thickness direction extending away from the sidewalls of the LED structure such that the bandgap of the passivation layer increases in the thickness direction away from the sidewall of the LED structure.

11. A light emitting diode precursor according to claim 1, further comprising an insulating layer provided over the passivation layer.

12. An array of light emitting diode precursors comprising:
a substrate;
a plurality of LED structures provided on the substrate, each LED structure provided on the substrate comprising a plurality of Group III-nitride layers including:
a p-type semiconductor layer;
an n-type semiconductor layer; and
an active layer between the p-type semiconductor layer and the n-type semiconductor layer,
wherein each of the plurality of Group III-nitride layers comprises a crystalline Group III-nitride, and each LED structure having a sidewall which extends in a plane orthogonal to a (0 0 0 1) crystal plane of the Group III-nitride layers; and
a passivation layer provided on the sidewall of each LED structure such that the passivation layer covers the active layer of the LED structure, the passivation layer comprising a crystalline Group III-nitride with a bandgap higher than a bandgap of the active layer;
wherein
each LED structure is shaped such that the sidewall of the LED structure is aligned with a non-polar crystal plane of each the layers of the LED structure.

* * * * *